United States Patent [19]

Olivenbaum et al.

[11] Patent Number: 4,982,195
[45] Date of Patent: Jan. 1, 1991

[54] SERVO CONTROL WITH SELF CALIBRATING PRESET

[75] Inventors: James E. Olivenbaum, Houston; Mark C. Fischer, Pasadena, both of Tex.

[73] Assignee: Tideland Signal Corporation, Houston, Tex.

[21] Appl. No.: 266,549

[22] Filed: Nov. 3, 1988

[51] Int. Cl.⁵ ............................................. G01S 13/80
[52] U.S. Cl. ...................................... 342/51; 342/83; 342/199
[58] Field of Search ................... 342/83, 199, 51, 82; 331/1 R, 1 A, 17

[56] References Cited

U.S. PATENT DOCUMENTS 4,063,173  12/1977  Nelson et al. .
4,412,219  10/1983  Briggs .

Primary Examiner—Nelson Moskowitz
Assistant Examiner—Mark Hellner
Attorney, Agent, or Firm—Fulbright & Jaworski

[57] ABSTRACT

A frequency input for receiving a frequency signal and digital storing for storing the received frequency signal. A controller has a first and second input and an output. The first input is connected to the digital storage for providing a reference signal and the output provides a frequency control signal. The second input is connected to circuitry for changing the operation mode of the controller to either an amplifier or an integratory. As an amplifier, a digitally set offset and gain is applied to the amplifier for providing an output generating approximately the frequency of a prior signal. A switch connects the frequency output to the second input when operating in the integrating mode to control the output for generating a desired frequency.

5 Claims, 2 Drawing Sheets

SERVO CONTROL WITH SELF CALIBRATING PRESET

BACKGROUND OF THE INVENTION

The present invention is directed to a circuit for controlling the frequency of a transmitter. In particular, it is directed to a servo loop to control the frequency of a transmitted signal and keep it equal to the frequency of a prior signal. And more particularly the present invention is useful in a circuit in a marine radar beacon. A marine radar transponder is a microwave transmitter which is triggered to a response by a radar pulse or racon from a ship resulting in a reply signal which locates and identifies the racon. The return signal must be synchronous with, and generated at the frequency of the received signal.

The present invention is directed to a servo loop with a self-calibrating output which is preset. The servo control loop has a controller which doubles as an integrator and an amplifier. The incoming radar signal is received and stored digitally and becomes a reference which does not drift. When in the amplifier mode, the offset and gain of the amplifier are digitally controlled. When the racon begins transmitting, the controller is switched to the integrator mode to slew the output to the correct frequency.

SUMMARY

The present invention is directed to an electrical circuit controlling frequency and includes a frequency input for receiving a frequency signal. Means are connected to the input for storing the frequency of the received signal. A controller is provided having first and second inputs and an output. The first input is connected to the storing means for providing a reference signal to the controller and the output provides a frequency control signal. Preferably, the storing means includes an analog to digital converter for storing the received frequency signal in digital form for avoiding drift. Means are connected to the second input for changing the operating mode for the controller to either an amplifier or an integrator. Switch means are provided for connecting the frequency input to the second input of the controller when it is operating in the integrator mode. The controller through its output controls a frequency that is made equal to the frequency of a prior signal stored in the storing means.

Still a further object of the present invention is wherein means are connected to the second input for Presetting the second input for providing a desired output when the controller is operating in the amplifier mode. Preferably, the means for presetting the second input includes means for controlling the offset and gain when the controller is operating in the amplifier mode and includes digital control means.

Still a further object of the present invention is the improvement in a marine radar transponder which receives a radar signal and includes means for generating a reply signal at the frequency of the received signal. The present invention is directed to an improvement in circuit means for controlling the frequency of the reply signal. The circuit includes a frequency input for receiving a radar signal and also for receiving a reply signal. Means are connected to the frequency input for measuring and storing the received radar signal. A servo controller is provided having first and second inputs and an output. The first input is connected to the storing means for providing a reference signal of the received radar signal. The output provides a control signal for generating a reply signal. Means are connected to the second input for changing the operating mode of the controller between an amplifying mode and an integrating mode. Switch means are provided for connecting the frequency input to the second input when the controller is operating in the integrated mode for integrating the reply signal relative to the stored reference signal.

Yet still a further object of the present invention is the provision of a digital to analog converter connected between the first input and the storing means.

Other and further objects, features and advantages will be apparent from the following description of a presently preferred embodiment of the invention, given for the purpose of disclosure and taken in conjunction with the accompanying drawings.

DESCRIPTION OF THE PREFERRED EMBODIMENT

Figure 1:
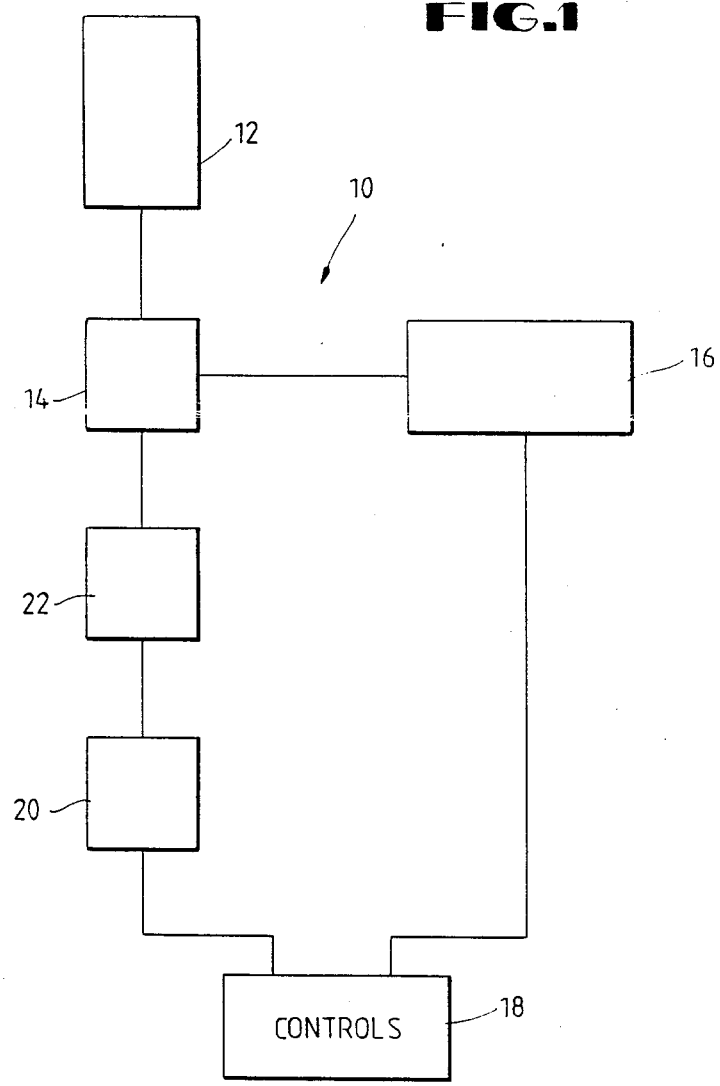
FIG. 1 is a block diagram of a conventional marine radar beacon system.

Referring now to the drawings, and particularly to FIG. 1, the reference numeral 10 generally indicates a block diagram of a racon. Racons generally have an X-band and an S-band system, only one of which will be described. The system 10 includes an antenna 12 for receiving interrogating radar pulses and for providing a return transmission. When a radar signal is received by the antenna 12, it is transmitted to a circulator 14 and then directed to a receiver 16 for measuring the amplitude and frequency of the received radar signal. The received signal 16 is transmitted to controls 18 which measure the received signal and then generate a reply signal at the same frequency as the received signal. The transmitted signal is generated by a voltage controlled oscillator (VCO) 20 and amplified by amplifier 22 and sent through the circulator 14 to the antenna 12 for transmission. The frequency control loop is closed by measuring the transmitted frequency using the detector 22 and thereafter controlling the frequency of the reply signal in an attempt to keep it equal to the frequency of the received signal.

Figure 2:
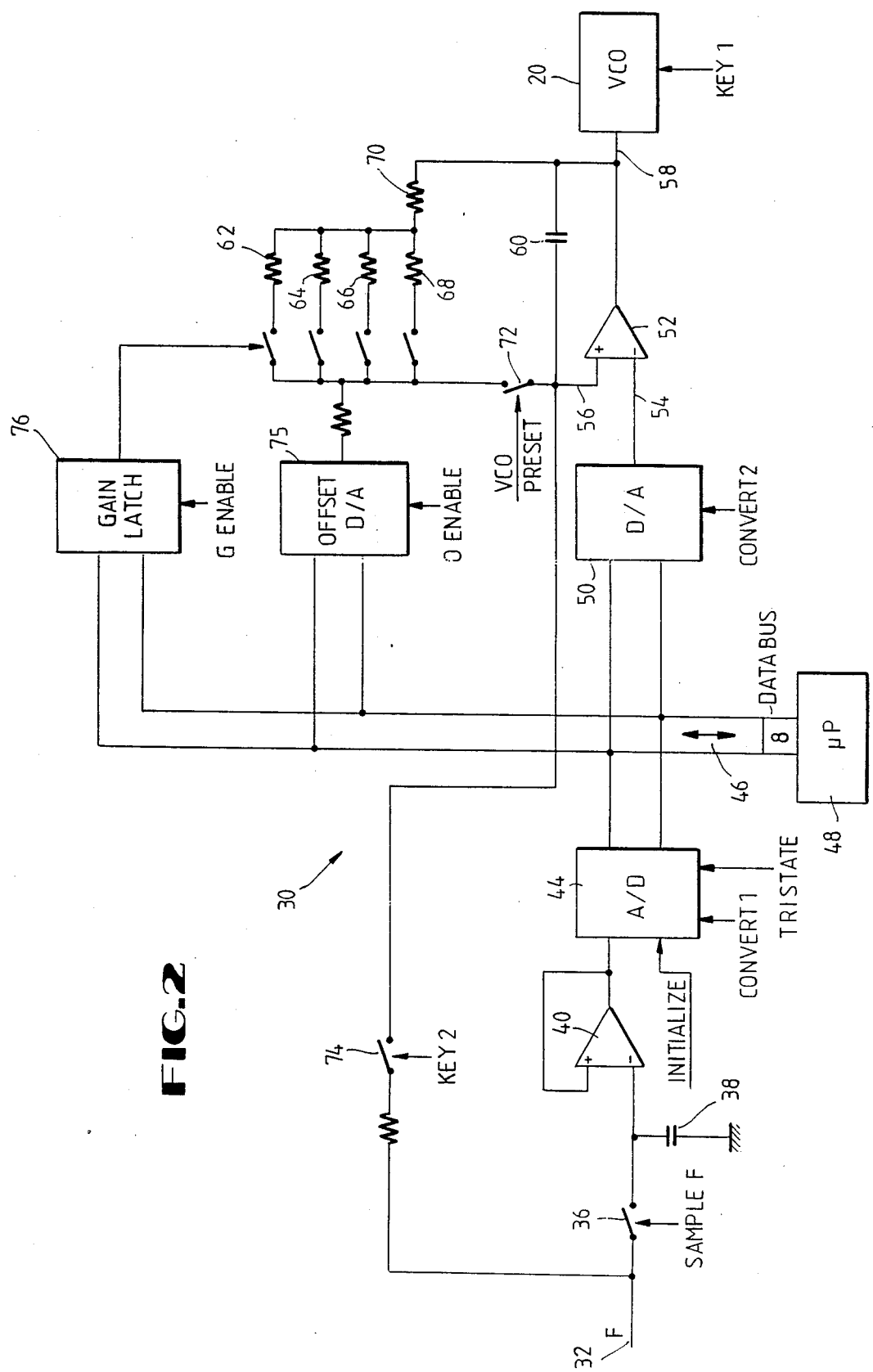
FIG. 2 is an electrical schematic of the control circuit of the present invention.

Referring now to FIG. 2, the reference numeral 30 generally indicates the frequency control loop for controlling the frequency of the reply signal to keep it equal to the frequency of the received signal. Line 32 is the frequency input line for receiving a frequency signal such as an incoming radar signal or the transmitted reply signal. The frequency input line 32 is connected to a conventional sample and hold circuit which includes a switch 36, a storage capacitor 38, and a buffer amplifier 40, all of which measures the frequency of the incoming signal. The sample and hold circuit measures and holds a voltage that is proportional to the input frequency on line 32 and transmits this voltage to an analog to digital (A/D) converter 44. This frequency measurement is then transmitted over the data bus 46 and may be stored, such as in a microprocessor 48, and is also transmitted to a digital to analog converter 50 which converts the frequency measurement to an analog voltage which serves as a reference voltage. It is to be noted that the frequency information is in digital form which now becomes a reference which will not drift with time as compared to information stored in a capacitor. That is, the digital to analog (D/A) converter 50 does not suffer from drift because the information stored is in a digital form.

A servo controller 52 is provided having a first input 54, a second input 56 and an output 58. The first output 54 is connected to the D/A converter 50 and receives, as the reference signal, the frequency measurement of the received radar signal. The output 58 provides a control signal for the VCO 20 for generating the reply signal. The controller 52 has two operating modes. One is as an integrator and the second is as an amplifier. In operating in the integrator mode, only the feedback capacitor 60 is in the feedback circuit of the controller 52. When the controller 52 is operating as an amplifier, one or more resistors 62, 64, 66, 68, 70 and 71 are switched into the feedback and input circuitry of the controller 52.

Switches 72 and 74 are provided. When the racon is in the receive mode, switch 72 is closed and switch 74 is open. When the racon is in the transmit mode, the switch 72 is open and the switch 74 is closed. When the racon is in the receive mode with the switch 72 closed, the resistors 62, 64, 66, 68 and 70 are connected into the feedback circuit along with an offset source determined by the offset to digital analog converter 75 and resistor 71. The number of the resistors connected in the operating mode depends upon and is controlled by the gain latch 76. The amplifier now becomes a non-inverting conventional operational amplifier and the gain of this amplifier is the total resistance in the feedback, resistors 62, 64, 66, 68 and 70 divided by the value of resistor 71 plus one. Setting of the gain by the latch 76 and the offset by offset D/A 75 will be discussed hereinafter.

When the racon is in the receiving mode, the incoming radar frequency is digitized and converted back to an analog voltage in the D/A converter 50 and applied to the operational amplifier 52 on input 54. In the amplifier mode, the controller 52 begins slewing its output 58 to the particular voltage set to approximate the correct voltage to set the VCO 20 to approximately the same frequency as that of the incoming radio frequency signal received on input frequency line 32.

Thus, in the receive mode, the racon 10 of FIG. 1 receives the incoming radar signal, measures it and sets the VCO 20 to the same frequency as that of the incoming radar signal.

After this, the racon 10 switches from the receive mode to the transmit mode, and the VCO 20 produces a reply frequency, which is amplified at amplifier 22, and transmitted to the circulator 14 and antenna 12. The reply signal is also transmitted to the detector 16 and applied to the incoming frequency line 32 (FIG. 2) where it is measured. Referring now to FIG. 2, when the racon 10 is in the transmit mode, the switch 72 is opened and the switch 74 is closed. It is to be noted that prior to the switch 74 being closed, the output voltage of the controller 52 which controls the VCO 20 is stored in the capacitor 60. When the switch 74 is closed, a portion of the transmitted reply signal comes back to the line 32 and is applied to the input 56 of the controller 52. If there is any difference in the voltage between the input line 32 and the input 54 from the D/A converter 50 output, it shows up as a differential voltage on the input to the controller 52 which is now acting as a loop integrator. In this case, the loop integrator will slew its output 58 such that there is no more voltage difference between the two inputs 54 and 56. That is, the controller 52 is acting as a servo controller. By doing this, its output 58 adjusts the VCO 20 so as to be on the same frequency as the prior received incoming radar pulse which was previously measured at the input 32 and stored in the D/A converter 50.

The microprocessor 48 or other suitable digital controller is connected to the data bus 46. The data bus is provided to transmit and receive information and signals between the computer 48, and the A/D converter 44, the D/A converter 50, the gain latch 76, and the offset D/A converter 75. When the controller 52 is operating in the amplifier mode, the offset D/A converter 75 provides an offset control and the gain latch 76 provides a gain control which are controlled from the data bus 46. For calibration purposes, a low frequency is selected, by the microprocessor 48 writing a digital word in D/A converter 50, the VCO transmitter is turned on and the frequency is measured via the input frequency line 32 through the sample and hold circuit and the A/D converter 44 to get a digital word out. This is transmitted to the microprocessor 48 which knows what frequency is actually being transmitted. This allows the microprocessor 48 to adjust the offset D/A converter 75 to allow the controller 52 in its amplifier mode to put the VCO 20 on the correct frequency as measured through the A/D converter 44. Through this calibration procedure, the switch 72 is closed and the switch 74 is opened. Then for calibration another frequency is selected, typically at the high end of the band, and this digital word is loaded into the D/A converter 50, and the same process of measuring the transmitted frequency of the VCO 20 through the line 32 and A/D converter 44 is performed. At this point in the calibration procedure, the gain latch 76 is adjusted to give the proper gain to the controller 52, in its amplifier mode, so as to be on frequenCy. In so doing we can adjust two points in a straight line. One of the points is near the origin which is offset and one is near the high end for gain. This curve can be moved up and down with the offset and the slope of the curve can be changed with gain control so as to preset the output of the controller 52 acting as an amplifier to nearly the correct frequency to begin transmission. Once calibration is achieved, then any frequency signal that comes in through the input frequency line 32 via the A/D converter 44, and the D/A converter 50 is converted to an analog voltage which will slew the VCO 20 to approximately the correct frequency. And, by opening the switch 72 and closing the switch 74, a fine adjustment of frequency is made by configuring the controller 52 as an integrator and the analog control loop brings the transmitted frequency signal very closely to the desired frequency, subject to whatever small errors may exist in the control loop.

The present circuit, therefore, provides a loop integrator in a servo control loop which doubles as an amplifier. This provides the ability to preset the integrator to approximately the right conditions for it to initialize. In addition, both the gain and the offset of the amplifier is controlled by a digital word. The frequency information is stored in a digital word and is not subject to drift.

The present invention, therefore, is well adapted to carry out the objects and attain the ends and advantages mentioned as well as others inherent therein. While a presently preferred embodiment of the invention has been given for the purpose of disclosure, numerous changes in the details of construction and arrangement of parts will be readily apparent to those skilled in the art and which are encompassed within the spirt of the invention and the scope of the appended claims.

What is claimed is:

1. In a marine radar beacon for receiving radar signal having means for generating a reply signal at the frequency of the received signal, the improvement in circuit means for controlling the frequency of the reply signal comprising, a frequency input for receiving a radar signal and for receiving a reply signal, means connected to the frequency input for measuring and storing the received radar signal, a servo controller having first and second inputs and an output, said first input connected to the storing means for providing a reference signal of the receivd radar signal, said output providing a control signal for generating a reply signal, means connected to the second input for changing the operating mode of the controller between an amplifying mode and an integrating mode, and switch means for connecting the frequency input to the second input when the controller is operating in the integrator mode.

2. The circuit of claim 1 wherein the storing means includes an analog to digital converter for storing the received radar signal in digital form.

3. The circuit of claim 1 including, means connected to the second input for presetting the second input when the controller is operating in the amplifier mode for providing an output generating approximately the desired frequency.

4. The circuit of claim 3 wherein the means for presetting includes a digital to analog offset means and a digitally actuated latch controlling the resistance connected to the second input.

5. The circuit of claim 1 including, a digital to analog converter connected between the first input and the storing means.

* * * * *